United States Patent
Sun et al.

[11] Patent Number: 6,057,180
[45] Date of Patent: May 2, 2000

[54] METHOD OF SEVERING ELECTRICALLY CONDUCTIVE LINKS WITH ULTRAVIOLET LASER OUTPUT

[75] Inventors: Yunlong Sun, Aloha; Edward J. Swenson, Portland, both of Oreg.

[73] Assignee: Electro Scientific Industries, Inc., Portland, Oreg.

[21] Appl. No.: 09/092,490

[22] Filed: Jun. 5, 1998

[51] Int. Cl.$^7$ .................................................. H01L 71/82
[52] U.S. Cl. ......................... 438/132; 438/128; 438/131
[58] Field of Search ..................... 438/132, 131, 438/128

[56] References Cited

U.S. PATENT DOCUMENTS

| | | | |
|---|---|---|---|
| 4,228,528 | 10/1980 | Cenker et al. | 365/200 |
| 4,598,039 | 7/1986 | Fischer et al. | 430/323 |
| 4,602,420 | 7/1986 | Saito | 29/571 |
| 4,644,130 | 2/1987 | Bachmann | 219/121 |
| 4,684,437 | 8/1987 | Donelon et al. | 156/643 |
| 4,780,177 | 10/1988 | Wojnarowski et al. | 156/643 |
| 4,810,049 | 3/1989 | Fischer et al. | 350/96.12 |
| 4,834,834 | 5/1989 | Ehrlich et al. | 156/636 |
| 4,853,758 | 8/1989 | Fischer | 357/51 |
| 4,894,115 | 1/1990 | Eichelberger et al. | 156/643 |
| 5,021,362 | 6/1991 | Chlipala | 437/173 |
| 5,066,998 | 11/1991 | Fischer et al. | 357/51 |
| 5,086,015 | 2/1992 | Itoh et al. | |
| 5,096,850 | 3/1992 | Lippitt, III | 437/173 |
| 5,108,785 | 4/1992 | Lincoln et al. | 427/96 |
| 5,185,291 | 2/1993 | Fischer et al. | 437/173 |
| 5,265,114 | 11/1993 | Sun et al. | 372/69 |
| 5,293,025 | 3/1994 | Wang | 219/121.71 |
| 5,378,313 | 1/1995 | Pace | 156/643 |
| 5,378,869 | 1/1995 | Marrs et al. | 219/121.71 |
| 5,536,579 | 6/1996 | Davis et al. | 428/421 |
| 5,541,731 | 7/1996 | Freedenberg et al. | 356/345 |
| 5,593,606 | 1/1997 | Owen et al. | 219/121.71 |
| 5,623,449 | 4/1997 | Fischer et al. | 315/200 |
| 5,652,169 | 7/1997 | Jun | 437/60 |
| 5,731,047 | 3/1998 | Noddin | 427/555 |
| 5,950,071 | 9/1999 | Hammond et al. | |

FOREIGN PATENT DOCUMENTS

| | | | |
|---|---|---|---|
| 0580408A1 | 1/1994 | European Pat. Off. | ........ B23K 26/00 |
| 4433535 | 12/1995 | Germany . | |
| 62-67834 | 3/1987 | Japan . | |
| 8-172063 | 7/1996 | Japan . | |
| 10151309 | 6/1998 | Japan | ............... H01L 21/82 |
| 9744155 | 11/1979 | WIPO . | |
| WO 9001374 | 2/1990 | WIPO | ............... B05B 3/06 |
| WO 9602351 | 2/1996 | WIPO | ............... B23K 26/00 |
| 9831049 | 7/1998 | WIPO . | |

OTHER PUBLICATIONS

James H. Brannon, "Excimer–Laser Ablation and Etching," Circuits & Devices Magazine, pp. 19–24, Sep. 1990.

(List continued on next page.)

*Primary Examiner*—Kevin M. Picardat
*Assistant Examiner*—D. M. Collins
*Attorney, Agent, or Firm*—Stoel Rives LLP

[57] ABSTRACT

Ultraviolet (UV) laser output (88) exploits the absorption characteristics of the materials from which an electrically conductive link (42), an underlying semiconductor substrate (50), and passivation layers (48 and 54) are made to effectively remove the link (42) without damaging the substrate (50). The UV laser output (88) forms smaller than conventional IR laser link-blowing spot diameters (58) because of its shorter wavelength, thus permitting the implementation of greater circuit density. A passivation layer positioned between the link and the substrate can be formulated to be sufficiently absorptive to UV laser energy and sufficiently thick to attenuate the laser energy to prevent it from damaging the substrate (50) in the laser beam spot area (43) in both the off-link and link-overlapped portions. The UV laser output (88) can be employed to controllably ablate a depthwise portion of the passivation layer (54) underlying the link (42) to facilitate complete removal of the link (42). In addition, direct ablation of the passivation layer (48) with the UV laser output (88) facilitates predictable and consistent link severing profiles. The absorption characteristics of the passivation material also reduces the risk of damage to neighboring links or other active structures.

45 Claims, 8 Drawing Sheets

OTHER PUBLICATIONS

Ronald P. Cenker et al., "A Fault–Tolerant 64K Dynamic RAM," ESI Technical Article, Reprinting of, ISSCC '79, Feb. 15, 1979.

Ronald P. Cenker et al., "A Fault–Tolerant 64K Dynamic Random–Access Memory," IEEE Transactions on Electron Devices, vol. ED–26, No. 6, Jun. 1979.

Ih–Chin Chen et al., "Microelectronic Device and Multilevel Interconnection Technology," SPIE—The International Society for Optical Engineering, vol. 2636, Oct. 25–26, 1995, Austin, TX.

H.S. Cole et al., "Dependence of Photoetching Rates of Polymers at 193 nm on Optical Absorption Depth," Appl. Phys. Lett. 48 (1), Jan. 6, 1986.

ESI, "Hybrid and SMT Trimming Solutions . . . and More!" LaserPulse, Fall 1993.

Electro Scientific Industries, Inc. "Model 4420 Laser Micromaching System Brochure," Sep. 1993.

Richard Harris, et al. "Micromachining" ESI Article Reprint S–2504 from *Advanced Packaging*, Spring 1993.

Craig Hutchens, "New Laser Technology Addresses the Yield Enhancement Challenge of the Evolving Generation of Memory Devices" ESI Publication dated Jun. 3, 1997 (written Oct. 31, 1995).

IBM, "Etch–Stop for Polymer Machining with an Argon Ion Laser," IBM Technical Disclosure Bulletin vol. 36, No. 1, Jan. 1993.

Y.S. Liu, et al. "Laser Ablation of P{olymers of High–Density Interconnect," Microelectronic Engineering 20 (Mar. 1993) 15–29 Elsevier.

Chih–Yuan Lu, et al., "Explosion of Poly–Silicide Links in Laser Programmable Redundancy for VLSI Memory Repair" IEEE Transactions on Electron Devices, vol. 36, No. 6, Jun. 1989.

James C. North, et al., "Laser Coding of Bipolar Read–Only Memories," IEEE Journal of Solid–State Circuits, Aug. 1976.

J.C. North, "Laser Vaporization of Metal films—Effect of Optical Interference in Underlying Dielectric Layers," Journal of Applied Physics, vol. 48, No. 6, Jun. 1977.

Myron J. Rand, "Reliability of LSI Memory Circuits Exposed to Laser Cutting," ESI Technical Article, Reprinted from the 17th Annual Proceedings, Reliability Physics 1979.

L.M. Scarfone, "Computer Simulation of Target Link Explosion in Laser Programmable Redundancy for Silicon Memory," Journal of Materials Research, vol. 1, No. 2, Mar./Apr. 1986.

Robert T. Smith, et al., "Laser Programmable Redundancy and Yield Improvement in a 64K DRAM," IEEE Journal of Solid–State Circuits, vol. SC–16, No. 5, Oct. 1981.

R. Srinivasan, et al., "Ultraviolet Laser Ablation of Organic Polymers," Chemical Reviews, 1989, vol. 89, No. 6.

Ven H. Shut, et al., "Effect of Vapor Plasma on the Coupling of Laser Radiation with Aluminum Targets," Avco Everett Research Laboratory, Inc., Apr. 25, 1978.

FIG. 1A
(PRIOR ART)
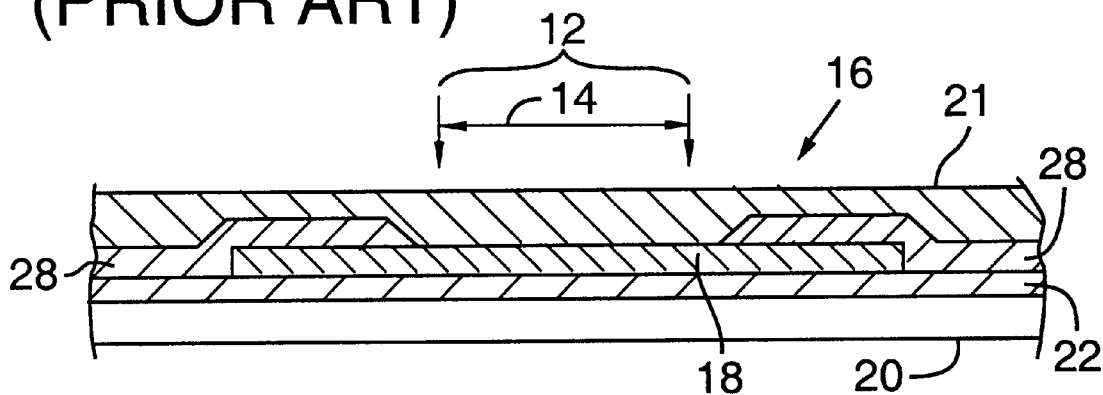
FIG. 1A
(PRIOR ART)
FIG. 1B
(PRIOR ART)
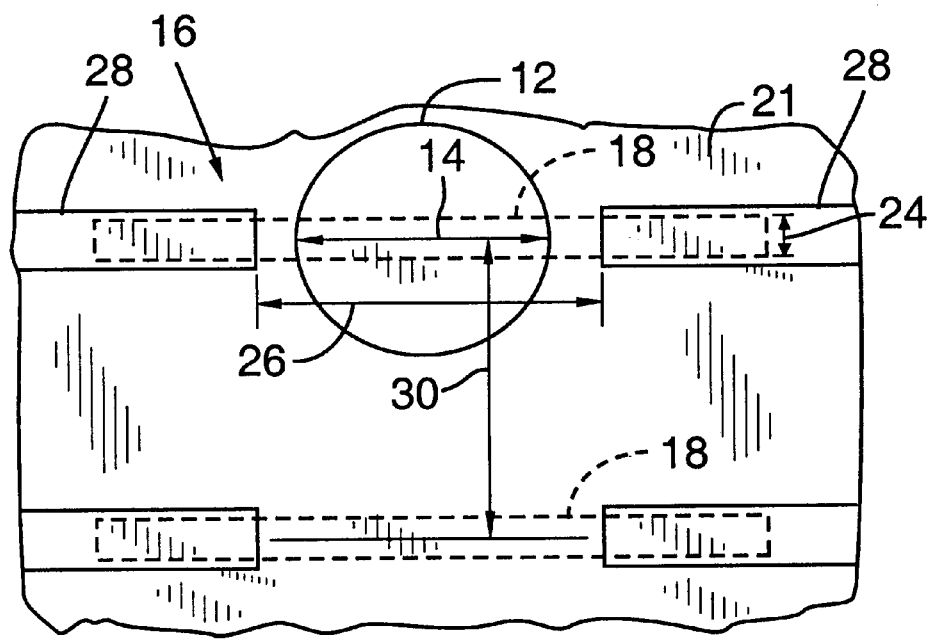

6,057,180

METHOD OF SEVERING ELECTRICALLY CONDUCTIVE LINKS WITH ULTRAVIOLET LASER OUTPUT

TECHNICAL FIELD

The present invention relates to a laser-based method for severing electrically conductive links in integrated circuit devices fabricated on a semiconductor wafer and, in particular, to such a method that employs an ultraviolet laser output having at a predetermined wavelength a power density of sufficient magnitude to sever a link positioned above a passivation layer characterized by height and absorption sensitivity that is sufficient to prevent the laser output from impinging the underlying substrate.

BACKGROUND OF THE INVENTION

Traditional 1.047 μm or 1.064 μm laser wavelengths have been employed for more than 20 years to explosively remove laser severable circuit links to disconnect, for example, a defective memory cell and substitute a replacement redundant cell in a memory device such as a DRAM, an SRAM, or an embedded memory. Similar techniques are also used to sever links to program a logic product, gate arrays, or ASICs. FIG. 1A shows a conventional infrared (IR) pulsed laser beam 12 of spot size diameter 14 impinging a link structure 16 composed of a polysilicon or metal link 18 positioned above a silicon substrate 20 and between component layers of a passivation layer stack including an overlying passivation layer 21 and an underlying passivation layer 22. Silicon substrate 20 absorbs a relatively small proportional quantity of IR radiation, and conventional passivation layers 21 and 22 such as silicon dioxide or silicon nitride are relatively transparent to IR radiation.

To avoid damage to the substrate 20 while maintaining sufficient energy to process a metal link 18, Sun et al. in U.S. Pat. No. 5,265,114 proposed using longer laser wavelengths, such as 1.3 μm, for processing links 18 on silicon wafers. At the 1.3 μm laser wavelength, the absorption contrast between the link material and silicon substrate 20 is much larger than that at the traditional 1 μm laser wavelengths. The much wider laser processing window and better processing quality afforded by this technique has been used in the industry for about three years with great success.

The IR laser wavelengths have, however, disadvantages: the coupling efficiency of an IR laser beam 12 into a highly electrically conductive metallic link 18 is relatively poor; and the practical achievable spot size 14 of IR laser beam 12 for link severing is relatively large and limits the critical dimensions of link width 24, link length 26 between contact pads 28, and link pitch 30. The IR laser link processing relies on heating, melting in link 18, and creating a mechanical stress build-up to explosively open overlying passivation layer 21. The thermal-stress explosion behavior is somewhat dependent on the width of link 18. As the link width becomes narrower than about 1 μm, the explosion pattern of passivation layers 21 becomes irregular and results in an inconsistent link processing quality that is unacceptable.

The practical achievable lower laser spot size limit, accounting for selection of optical elements and their clearance from substrate 20, for a link-severing laser beam 12 can be conveniently approximated as twice the wavelength (2λ). Thus, for 1.32 μm, 1.06 μm, and 1.04 μm laser wavelengths, the practical spot size limits for link removal are diameters of roughly 2.6 μm, 2.1 μm, and 2.0 μm, respectively. Since the lower limit of usable link pitch 30 is a function of laser beam spot size 14 and the alignment accuracy of laser beam 12 with the target location of link 18, the lower spot size limit directly affects the density of circuit integration.

The smallest focused material-removing laser spot size 14 currently used in the industry for repairing 64 megabit DRAMs is about 2 μm in diameter. A spot size 14 of 2.1 μm is expected to be useful through 256 megabit and some 1 gigabit DRAM designs. FIG. 2 is a graph of spot size versus year, demonstrating industry demands for smaller spot sizes as the link pitch 30 and link width 24 decrease. The graph is based on a simple formula for approximating spot size demands: spot size diameter=2(minimum link pitch)−2 (system alignment accuracy)−(link width). (These parameters are shown in FIG. 1B.) The graph assumes 0.5 μm accuracy through the year 1997, 0.35 μm accuracy through the year 1999, and 0.25 μm accuracy thereafter. Accordingly, industry experts predict that spot sizes under 2 μm will soon be desirable for processing links 18. These spot sizes are not, however, practically achievable with conventional IR link-blowing laser wavelengths.

Shorter visible wavelengths, such as 0.532 μm, would permit a reduction in the laser beam spot size. However, at these wavelengths the silicon substrates 20 are strongly absorbing and the laser link-severing process would damage part of the substrate 20. Substrate damage is unacceptable for the sake of ensuring reliability of the processed device.

What is needed, therefore, is a processing method and apparatus for severing electrically conductive links fabricated on a semiconductor wafer with selected laser wavelengths that reduce the practical beam spot size to considerably less than 2 μm but do not damage the semiconductor wafer substrate while severing the links.

SUMMARY OF THE INVENTION

An object of the present invention is, therefore, to provide a laser-based method that employs ultraviolet (UV) laser output to sever an electrically conductive link fabricated in an integrated circuit structure on a semiconductor wafer without damaging the underlying wafer substrate.

Another object of this invention is to provide such a method that is practiced with selected laser output parameters to exploit the wavelength-sensitive light absorption characteristics of certain link structure component materials to reduce coupling of the laser output energy into the substrate during link severing.

The present invention provides a laser output beam in the UV wavelength range to sever an electrically conductive link in an integrated circuit structure. This wavelength range is nonconventional for link processing, and the invention exploits the wavelength-sensitive light absorption characteristics of the passivation layer positioned between the link and the substrate. Since conventional passivation materials, such as silicon dioxide and silicon nitride, exhibit relatively high absorption of UV radiation, they can be employed to absorb extraneous UV laser output energy and prevent it from damaging the substrate. These and other passivation materials can be further optimized to better absorb preferred UV laser wavelengths.

More specifically, a layer of passivation material underlying the link absorbs the UV laser energy striking the integrated circuit structure, which energy is distributed over a beam spot size area that covers the link width and an adjacent portion of the passivation layer not overlapped by the link. Because it absorbs UV light, the underlying passivation layer attenuates the UV light and prevents it from damaging the wafer substrate at the energy level required to sever the link. In the absence of absorption of UV light by the underlying passivation layer, the off-link laser output energy incident to the adjacent portion would cause substrate damage during the link severing process.

Moreover, the bottom part of the link is a difficult portion to fully remove, and incomplete removal of this portion results in a low open circuit resistance after link severing. To ensure complete severing of the link, a laser beam controller causes the UV laser to partly cut into and thereby form a dent in the underlying passivation layer to facilitate clean depth-wise removal of the entire link within the spot area. The controller determines the depth of the dent by controlling the amount of laser energy used to carry out the link severing process. The height of the passivation material can also be adjusted to be sufficiently thick to absorb residual laser energy following link removal. Thus, there is no risk of damage to the surrounding or underlying substrate material.

Another advantage of using a UV wavelength for link processing is the smaller beam spot size as compared with that produced at IR wavelengths. For example, a 0.5 $\mu$m beam spot size for a 212 nm wavelength is readily achievable, compared to a 2.5 $\mu$m beam spot size for a 1 $\mu$m wavelength. The smaller link feature size will permit manufacture of more densely packed IC devices. For integrated circuit structures having a passivation layer overlying the links, another advantage of the invention is that removal of the overlying passivation layer results not only from thermal induced stress build-up in, but also from partial direct ablation of, the overlying passivation layer by the UV laser energy. This phenomenon makes possible consistently accurate opening of the overlying passivation layer and is, therefore, beneficial in cutting very narrow link widths, which otherwise suffer from irregular rupture profiles when link heating causes the overlying passivation layer to explode in accordance with conventional link severing processes.

Still another advantage of this invention stems from the high absorption of the UV laser energy by the passivation layer material. In conventional IR link processing, neighboring links are commonly damaged by laser energy reflected sideways from the link being processed. This problem is becoming more frequent as the pitch between links continues to decrease. However, light reflected sideways by a link undergoing severing with UV laser energy can be attenuated by the passivation material, thereby greatly reducing the risk of damage to neighboring links or other circuit structures.

Additional objects and advantages of the invention will be apparent from the following detailed description of preferred embodiments thereof, which proceeds with reference to the accompanying drawings.

BRIEF DESCRIPTION OF THE DRAWINGS

FIG. 1A is a fragmentary cross-sectional side view of a conventional semiconductor link structure receiving a laser pulse characterized by prior art pulse parameters.

FIG. 1B is a diagram showing the interrelationship of the link width, pitch, and laser beam spot size parameters described with reference to FIG. 1A, together with an adjacent circuit structure.

DETAILED DESCRIPTION OF PREFERRED EMBODIMENTS

The method of the present invention facilitates for link removal the use of shorter wavelengths, such as wavelengths in the UV range, and thereby permits a reduction in the laser beam spot size. Wavelengths shorter than or equal to 400 $\mu$m facilitate the generation of laser beam spot sizes of less than 0.8 $\mu$m. The wavelength-dependent absorption characteristics of several common link materials are discussed below.

Figure 2:
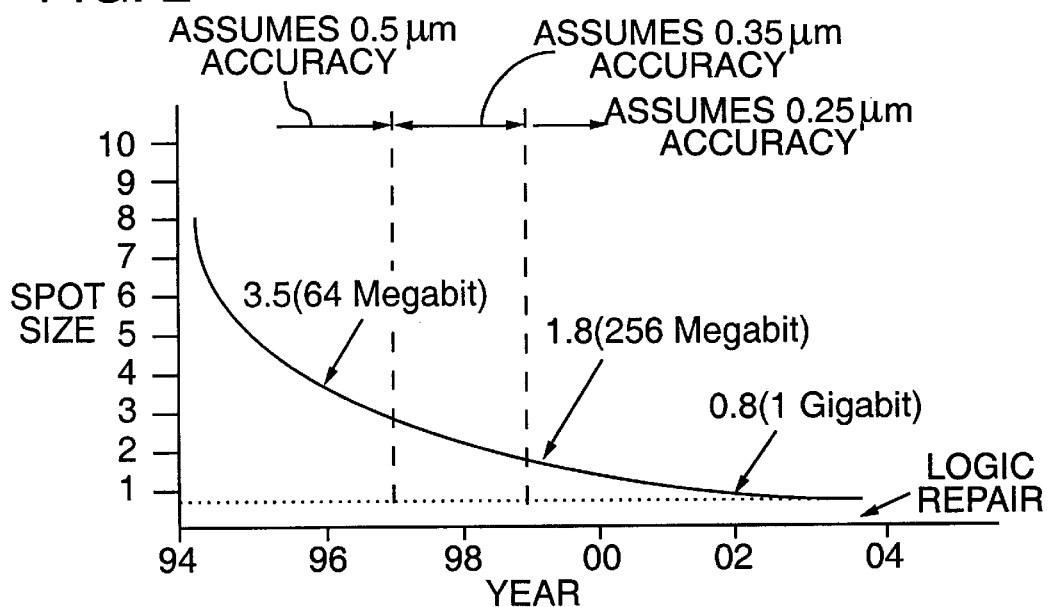
FIG. 2 is a graph of spot size versus year predicting the laser spot sizes that will be needed over time for link processing.
Figure 3:
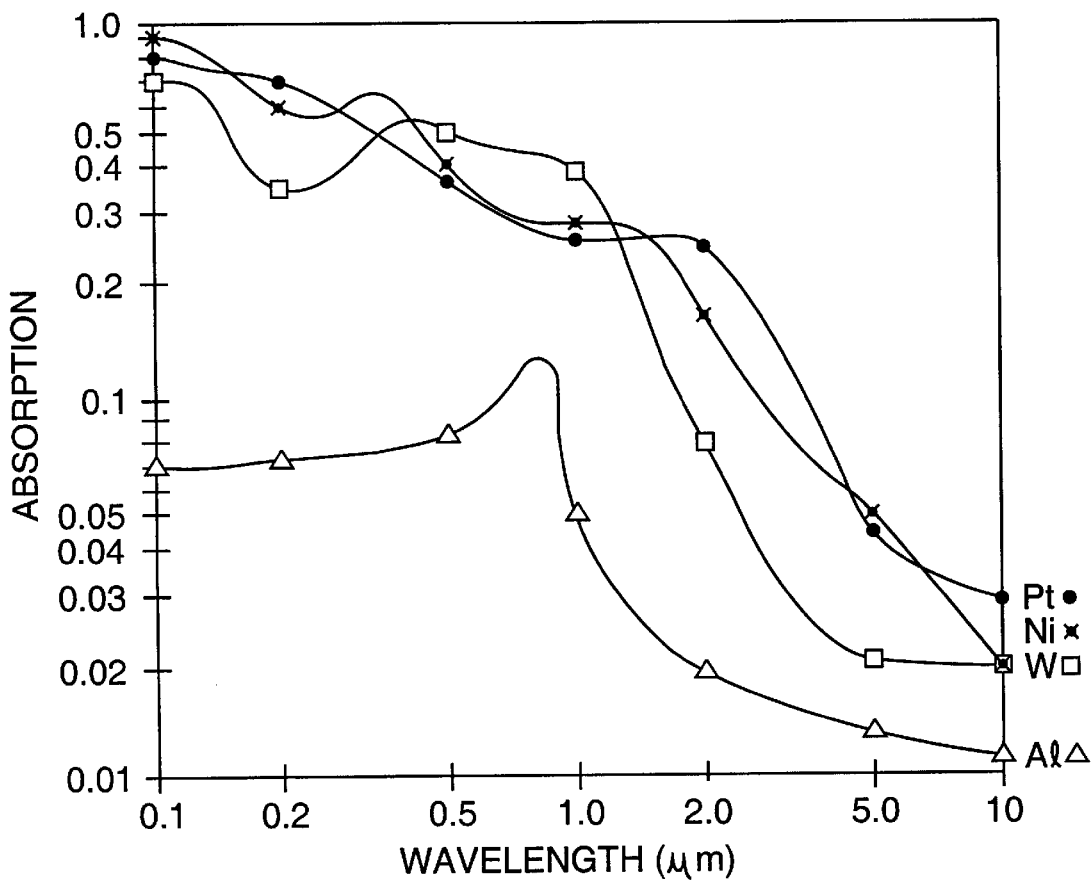
FIG. 3 shows graphical representations of the optical absorption properties of four different metals versus wavelength.

FIG. 3 graphically shows the optical absorbance properties of different metals such as aluminum, nickel, tungsten, and platinum that may be used as links 18. FIG. 3 is a compilation of the relevant portions of absorbance graphs found in "Handbook of Laser Science and Technology," Volume IV Optical Materials: Part 2 By Marvin J. Weber (CRC Press, 1986). FIG. 3 shows that metals, such as aluminum, nickel, tungsten, and platinum, in general absorb laser energy better at UV wavelengths than at IR wavelengths. Metal nitrides (e.g., titanium nitride) and other electrically conductive materials used to form conductive links 18 generally have similar optical absorption characteristics. However, the absorption coefficients for such materials are not so readily available as are those for metals.

The high absorption of wavelengths in the UV wavelength range, and particularly below 300 nm, exhibited by these link materials would suggest that they would be easily processed by UV laser output. Thus, in addition to the spot size advantage, UV laser output offers much better coupling efficiency into conductive links to achieve cleaner link removal, better open resistance quality across severed links, and higher link processing yields.

Unfortunately, many semiconductor substrates are also more susceptible to damage from laser outputs having wavelengths shorter than 1 μm. The absorption characteristics of several common substrate materials are described below.

Figure 4:
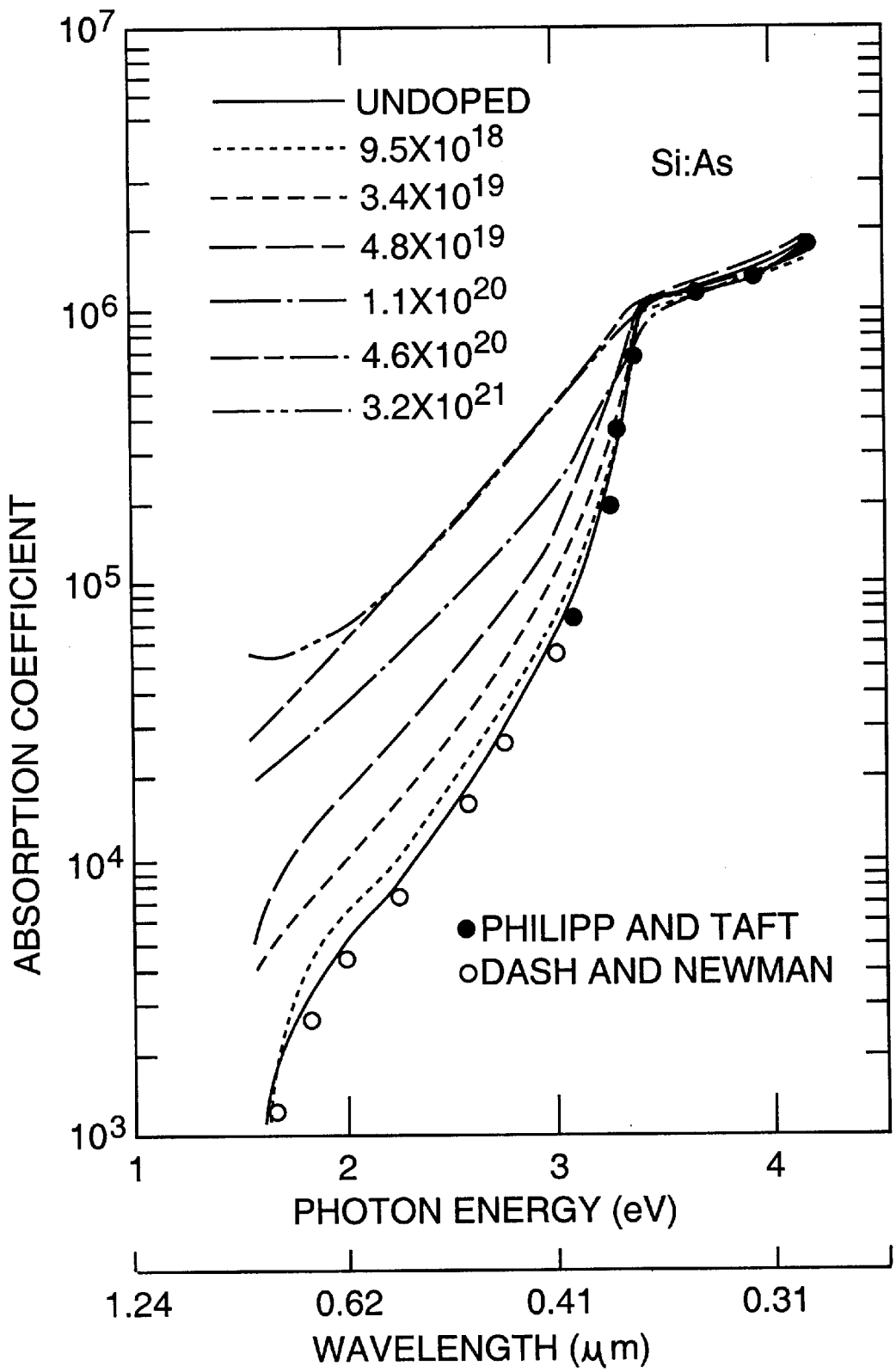
FIG. 4 shows graphical representations of the optical absorption coefficient versus laser photon energy (wavelength) for several arsenide concentrations in silicon.

FIG. 4 graphically shows the optical absorption coefficient versus laser photon energy (wavelength) for several arsenide concentrations in silicon. FIG. 4 is a replication of a figure from Jellison et al., *Phys. Rev. Let.,* Vol. 46, 1981, at 1414. FIG. 4 reveals that both doped and undoped silicon exhibit a sharp increase of absorption coefficient at wavelengths shorter than about 1 μm. Detailed physics of this behavior are described in "Pulsed Laser Processing of Semiconductors," *Semiconductors and Semimetals,* Vol. 23 (Academic Press, Inc., 1984).

Although a reliable publication of the optical absorption versus wavelength for doped polysilicon, polycide, and disilicide is not readily available, skilled persons might expect that the absorption coefficients for these doped materials would also increase significantly at wavelengths shoter than 1 μm.

Figure 5:
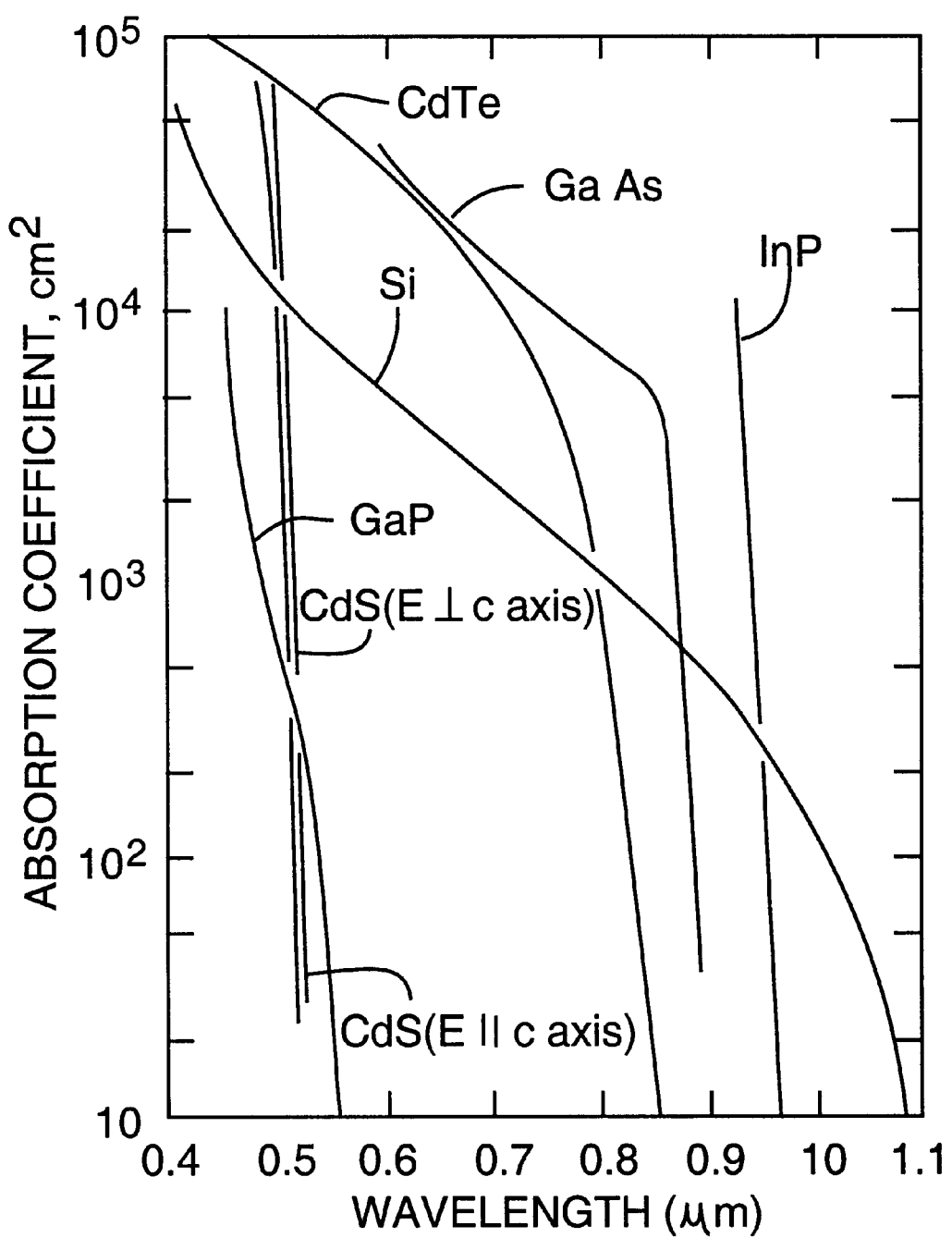
FIG. 5 shows graphical representations of the optical absorption properties versus wavelength for various semiconductors at room temperature.

FIG. 5 graphically shows the optical absorption coefficient versus wavelength for various semiconductors, including gallium arsenide and silicon at room temperature. FIG. 5 is a replication of FIG. 156 from *"Handbook of Optics,"* Walter G. Driscoll ed., Optical Society of America (McGraw-Hill Book Co., 1978). The graph reveals that at room temperature, the optical absorption of silicon, gallium arsenide, and other semiconductor materials increases more dramatically at wavelengths in the visible and UV range than in the IR range. With reference to FIGS. 4 and 5, the high absorption of wavelengths in the UV range by these substrates suggests that they would be subject to damage by UV laser output.

Figure 6A:
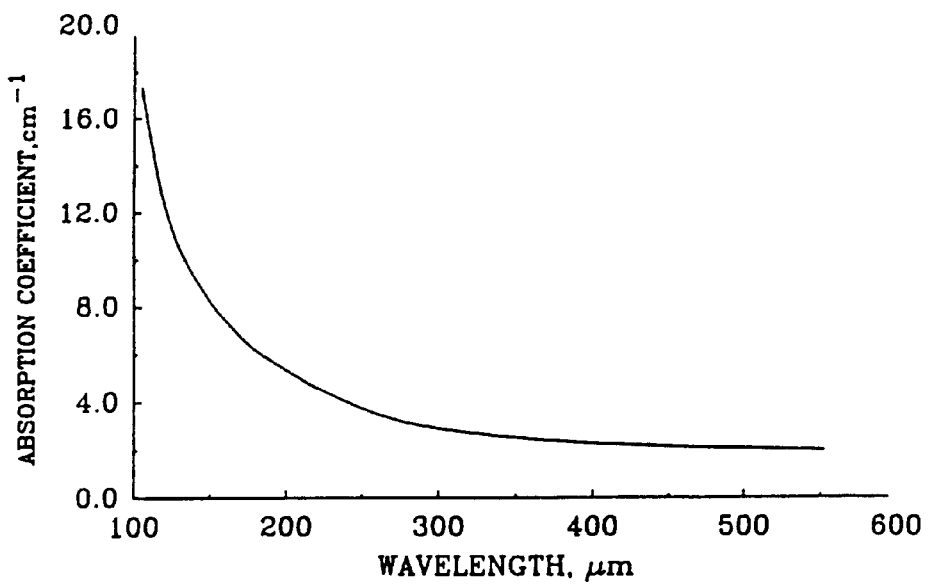
FIGS. 6A and 6B show graphical representations of the optical absorption properties versus wavelength for common passivation materials, particularly silicon dioxide and silicon nitride.

FIG. 6A graphically shows the optical absorption coefficient versus wavelength for fused silica (silicon dioxide), which is an inorganic dielectric material. FIG. 6A is adapted from C. M. Randall and R. Rawcliff, Appl. Opt. 7:213 (1968). The graph reveals that silicon dioxide exhibits good absorption characteristics at wavelengths shorter than about 300 μm, and its absorption behavior dramatically increases at wavelengths shorter than 200 nm. Skilled persons will appreciate that silicon dioxide passivation layers are typically doped, either intentionally or as a consequence of diffusion from a doped wafer. Common dopants include Group III and Group V elements, such as boron, phosphorous, arsenic, and antimony. The silicon dioxide passivation layer also typically contains defects. With doping and/or defects, the silicon dioxide or silicon nitride passivation layer becomes relatively absorbing at longer wavelengths, such as about shorter than or equal to 400 nm. Skilled persons will appreciate that the particular dopant and its concentration can be adjusted to "tune" the passivation layer to better absorb the desired UV laser wavelength.

Figure 6B:
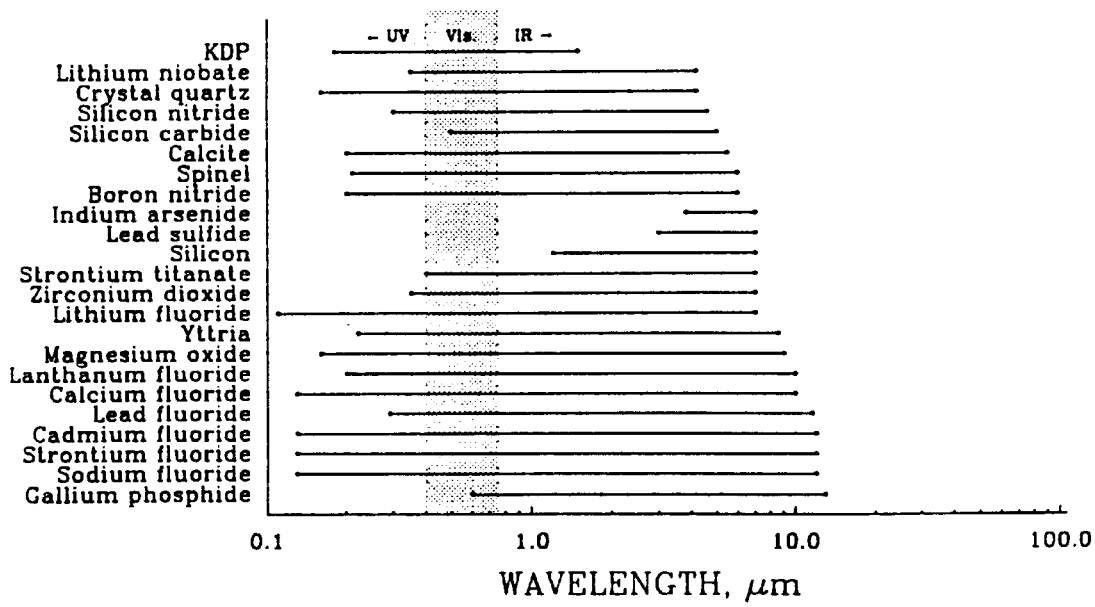

FIG. 6B graphically shows the optical transmission range versus wavelength for several crystalline optical materials, including silicon nitride, which is an inorganic dielectric material. FIG. 6B is a replication of FIG. 5.1 from Chapter 4 of the Handbook of Infrared Optical Materials, edited by Paul Klocek© Marcel Dekker, Inc., New York 1991. FIG. 6B shows that the transmissivity of silicon nitride diminishes below about 300 nm.

Figure 7A:
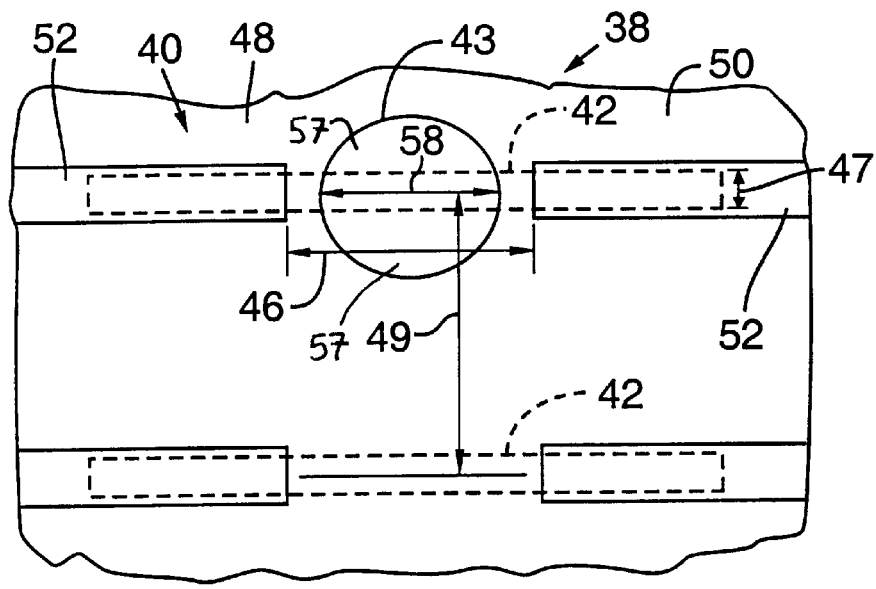
FIG. 7A is an enlarged fragmentary top view of a semiconductor link structure of the present invention, together with an adjacent circuit structure.
Figure 7B:
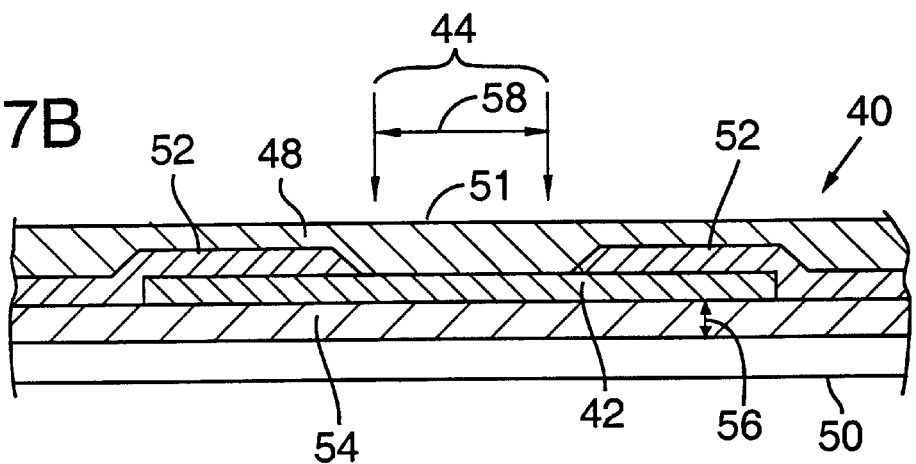
FIG. 7B is an enlarged fragmentary cross-sectional side view of the link structure of FIG. 7A receiving a laser pulse characterized by pulse parameters of the present invention.
Figure 7C:
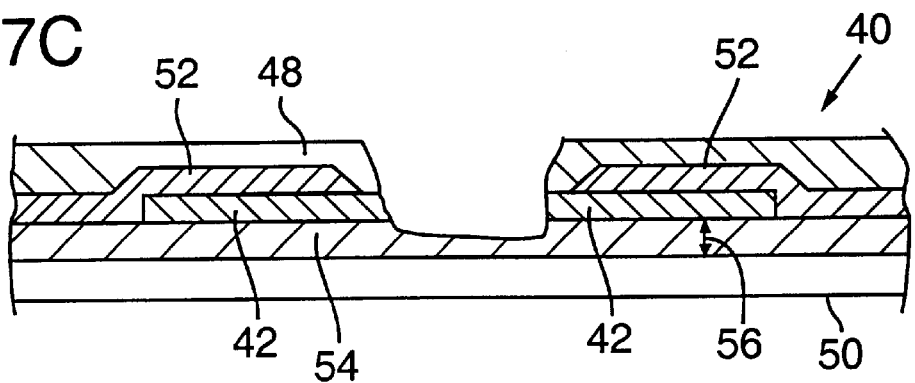
FIG. 7C is a fragmentary cross-sectional side view of the link structure of FIG. 7B after the link is removed by a laser pulse of the present invention.

FIG. 7A is an enlarged fragmentary top view of a wafer 38 having a semiconductor link structure 40 of the present invention; FIG. 7B is an enlarged fragmentary cross-sectional side view of link structure 40 receiving a spot area 43 of laser pulse 44 characterized by pulse parameters of the present invention; and FIG. 7C is an enlarged fragmentary cross-sectional side view of link structure 40 of FIG. 7B after link 42 has been removed by laser pulse 44. With reference to FIGS. 7A–7C, link structure 40 preferably includes a metallic or conductive link 42 having a link length 46 between contact pads 52 and a link width 47. Link width 47 can be designed to be smaller than the width 24 (about 2.5 μm) of link 18 blown by conventional IR link-blowing laser beam 12. Link materials may include, but are not limited to, aluminum, copper, nickel, tungsten, platinum, and gold, as well as other metals, metal alloys such as nickel chromide, metal nitrides (e.g., titanium or tantalum nitride), metal silicides such as tungsten silicide, and doped polysilicon and like materials. Although link structures 40 can have conventional sizes, the link width 47 can, for example, be less than or equal to about 1.0 μm. Similarly, center-to-center pitch 49 between links 42 can be substantially smaller than the pitch 30 (about 8 μm) between links 18 blown by beam 12. Link 42 can, for example, be within 2.5 μm of other links 42 or adjacent circuit structures. If a 212 nm beam is employed with a spot size of less than or equal to about 0.5 μm to sever link 42, then pitch 49 can be less than or equal to about 1.0 μm.

Link structures 40 typically include a UV absorbing passivation layer 48 overlying links 42. However, skilled persons will appreciate that links 42 may be uncovered. Link structures 40 also include a UV absorbing passivation layer 54 positioned between a substrate 50 and link 42.

Passivation layer 54 preferably has a height 56 large enough to attenuate by a sufficient amount the UV laser energy used to sever link 42 so that substrate 50 will not be damaged. For a passivation layer 54 comprising silicon dioxide or silicon nitride, height 56 is preferably at least about 0.5 μm, and more preferably about 0.8 μm. The height 56 of passivation layers 48 and/or 54 can particularly be adjusted so that their off-link portions 57 within spot area 43 attenuate sufficient energy from pulse 44 to protect the off-link portion of the substrate 50 from damage. Passivation layers 48 and 54 may comprise the same or different materials. Passivation layers 48 and/or 54 may also be doped to increase its absorptivity at longer UV wavelengths, such as between 300 nm and 400 nm.

In addition to the advantages of UV utilization discussed above, passivation layer 54 permits other processing advantages. With reference to FIG. 7B, height 56 can be adjusted to permit intentional partial ablation of passivation layer 54. The partial ablation of passivation layer 54 facilitates complete removal of the bottom of link 42 without risk of damage to substrate 50 to achieve a high open resistance across contact pads 52.

Figure 8:
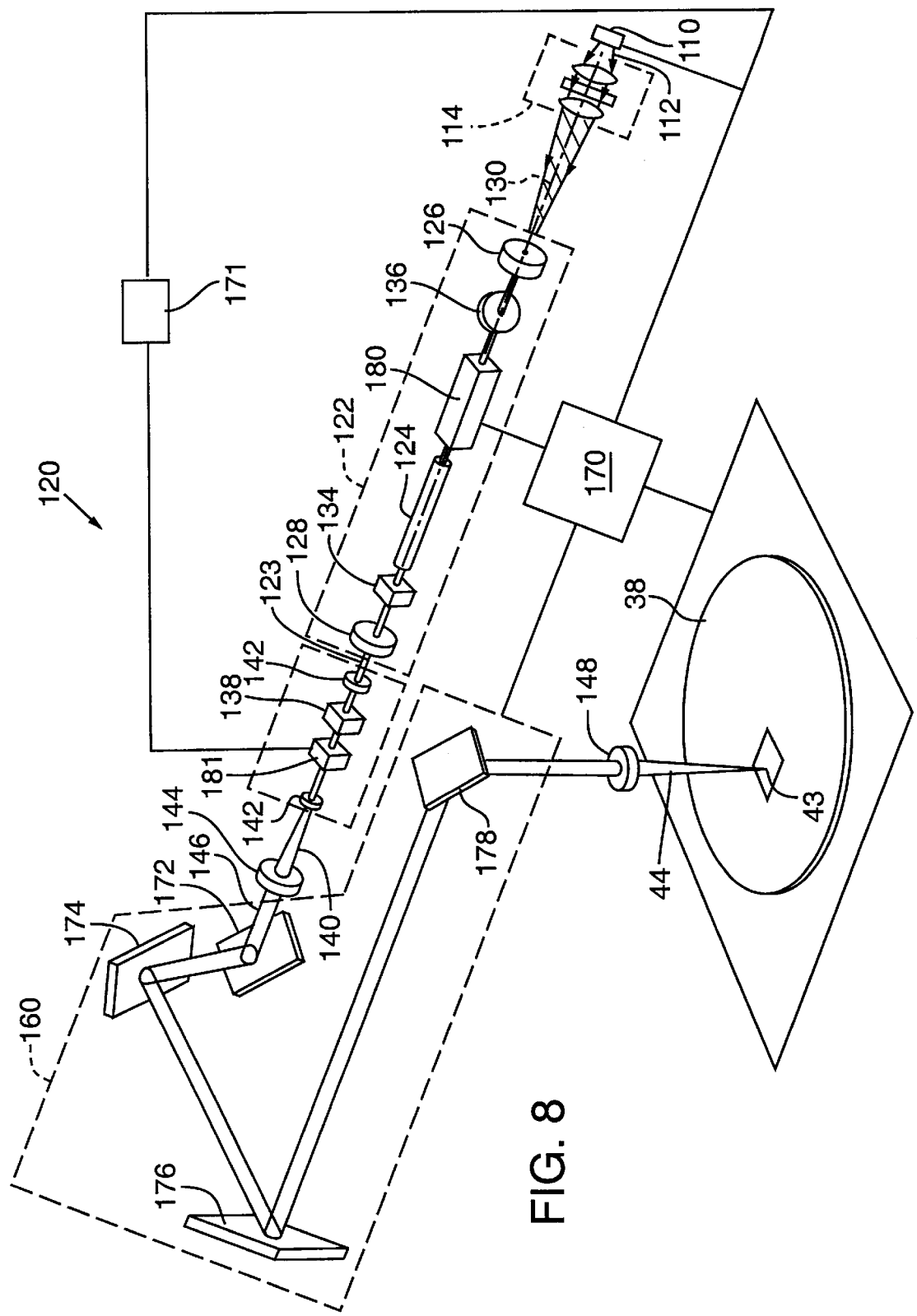
FIG. 8 is a partly schematic, simplified diagram of one embodiment of a preferred UV laser system including a wafer positioner that cooperates with a laser processing control system for practicing the method of the present invention.

FIG. 8 shows a preferred embodiment of a simplified laser system 120 for generating laser pulses desirable for achieving UV link severing in accordance with the present invention. For convenience, laser system 120 is modeled herein only by way of example to a fourth harmonic Nd:YAG laser pumped by a laser diode 110, the emission 112 of which is focused by lens components 114 into IR laser resonator 122. IR laser resonator 122 includes a lasant 124 positioned between a rear mirror 126 and an output mirror 128 along an optic axis 130 and emits IR pulsed output 123 at a wavelength of 1064 nm with characteristic pulsewidths of less than 10 ns, FWHM. Mirror 126 is preferably 100 percent reflective to the fundamental Nd:YAG wavelength and highly transmissive to the output of diode laser 110, and mirror 128 is preferably 100 percent reflective to the fundamental Nd:YAG wavelength and highly transmissive to the second harmonic light propagating along optic axis 130. An intra-resonator frequency doubler 134 is preferably positioned between the lasant 124 and output mirror 128. A quadrupler 138 is preferably placed external to resonator 122 to further convert the laser beam frequency to the fourth harmonic.

The laser system can also be configured to generate the fifth harmonic (212 nm for the Nd:YAG, 210 for Nd:YLF) by either using another nonlinear crystal to combine the fundamental and the fourth harmonic or to combine the second harmonic and the third harmonic. Harmonic conversion processes are described in pp. 138–141, V. G. Dmitriev, et. al., "Handbook of Nonlinear Optical Crystals", Springer-Verlag, New York, 1991 ISBN 3-540-53547-0.

IR laser resonator 122 may alternatively be a Nd:YLF laser having a 1.047 $\mu$m fundamental wavelength or a Nd:YVO$_4$ laser having a 1.064 $\mu$m fundamental wavelength. Skilled persons will also appreciate that the third harmonics of Nd:YAG (355 nm) and Nd:YLF (349 nm) may be employed to process links 42 surrounded by doped passivation materials. Skilled persons will also appreciate that other suitable lasers emitting at wavelengths shoter than 300 nm are commercially available and could be employed. Modification of a laser system such as, for example, from the Model 9300 series, manufactured by Electro Scientific Industries, Inc., Portland, Oreg., is preferred for adaptation by skilled persons to accommodate a shorter wavelength, UV laser.

Laser system output 140 can be manipulated by a variety of conventional optical components 142 and 144 that are positioned along a beam path 146. Components 142 and 144 may include a beam expander or other laser optical components to collimate UV laser output 140 to produce a beam with useful propagation characteristics. Beam reflecting mirrors 172, 174, 176 and 178 are highly reflective at the fourth harmonic UV laser wavelength, but highly transmissive at the second harmonic of the Nd:YAG, so only the fourth harmonic UV will reach surface 51 of link structure 40. A focusing lens 148 preferably employs an F1, F2, or F3 single component or multicomponent lens system that focuses the collimated UV pulsed output 140 to produce a focused spot size 58 that is significantly less than 2 $\mu$m, and most preferably less than or equal to about 0.5 $\mu$m. The focused laser spot 43 is directed over wafer 38 to target link structure 40 to preferably remove link 42 with a single pulse 44 of UV laser output 140. The severing depth of pulse 44 applied to link 42 can be accurately calculated and controlled by choosing the energy of pulse 44. In general, preferred ablation parameters of focused spot size 58 include pulse energies between 0.01 $\mu$J and 10 $\mu$J, of pulses 44 having 1 ns to 100 ns duration at about 1 to 5 kHz, preferably 15 ns at 5 kHz.

A preferred beam positioning system 160 is described in detail in U.S. Pat. No. 4,532,402 of Overbeck. Beam positioning system 160 preferably employs a laser controller 170 that controls at least two platforms or stages and multiple reflectors 172, 174, 176, and 178 to target and focus laser system output 140 to a desired laser link 42 on wafer 38. Beam positioning system 160 permits quick movement between links 42 on the same or different dies to effect unique link severing operations based on provided test or design data. The position data preferably direct one pulse of laser system output 140 at a time toward each discrete link 42.

For intracavity laser beam modulation employing a Q-switch 180 as shown in FIG. 8, laser controller 170 may be influenced by timing data that synchronizes the firing of laser system 120 to the motion of the platforms such as described in U.S. Pat. No. 5,453,594 of Konecny for Radiation Beam Position and Emission Coordination System. Alternatively, skilled persons will appreciate that laser controller 170 may be used for extracavity modulation of continuous wave (CW) laser energy via a Pockels cell or an acousto-optic device. This alternative can provide constant peak power regardless of the chopping repetition rate or output pulse duration time. Beam positioning system 160 may alternatively or additionally employ the improvements or beam positioners described in U.S. Pat. No. 5,751,585 of Cutler et al, which is assigned to the assignee of this application.

Figure 9A:
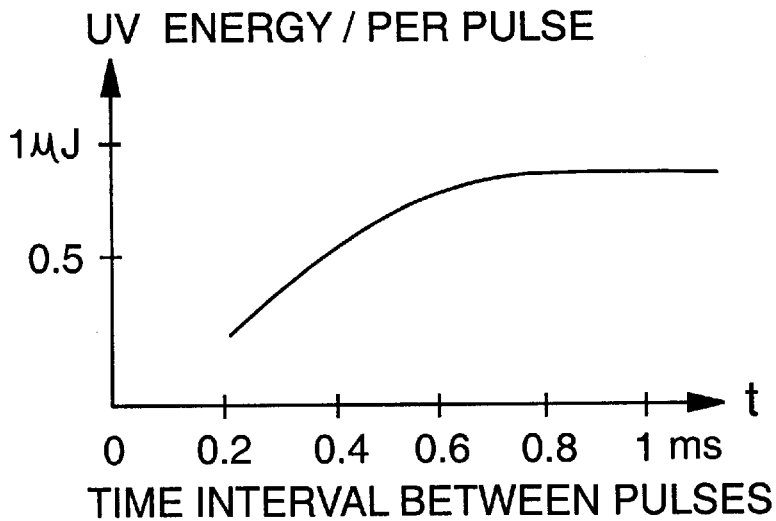
FIG. 9A shows a graphical representation of the variation in energy per pulse of conventional UV laser output as a function of the time interval between the pulses.
Figure 9B:
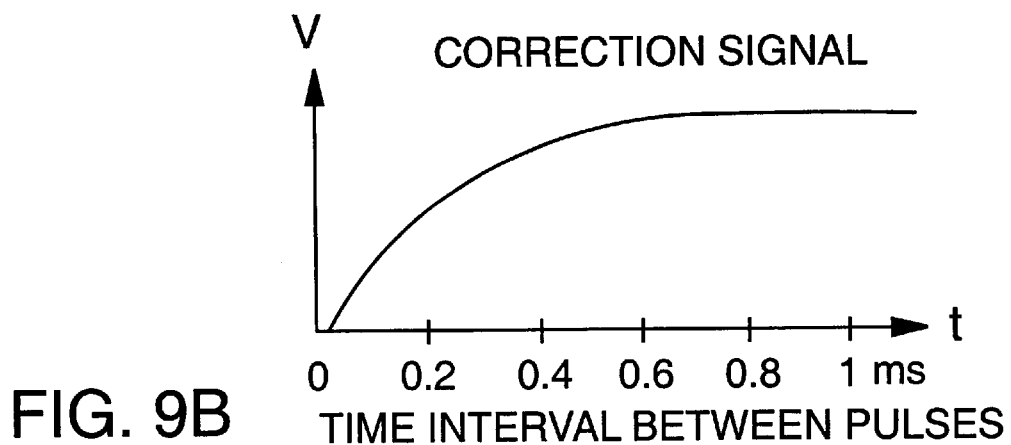
FIG. 9B shows a graphical representation of a voltage correction signal applied to stabilize the energy per pulse of UV laser output generated at varying time intervals.
Figure 9C:
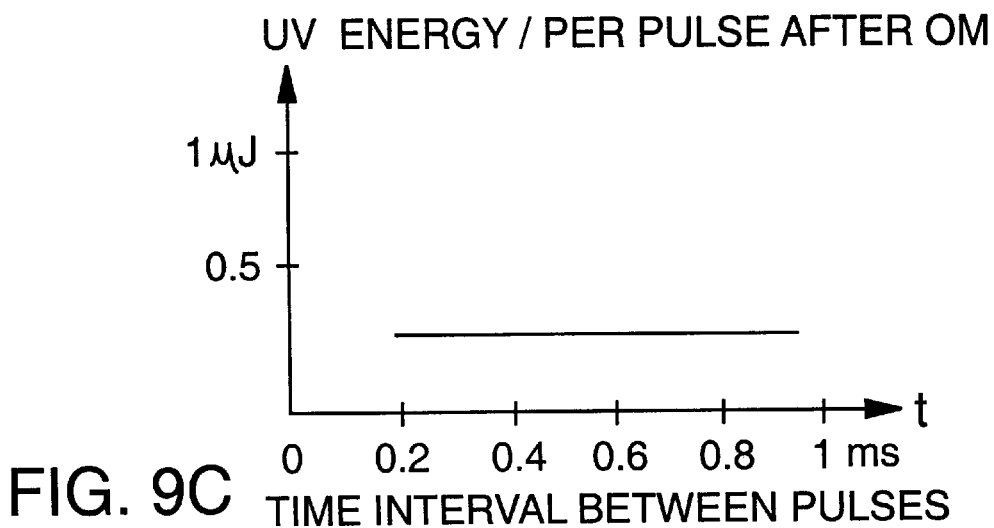
FIG. 9C shows a graphical representation of the energy per pulse of UV laser output of the present invention that has been corrected for instability associated with a varying time interval between pulses.

For Q-switched pulsed solid state UV lasers using non-linear frequency conversion, the pulse to pulse power levels of the UV output are particularly sensitive to the repetition rate or the interval time between consecutive pulse firings. FIG. 9A is a graph of the UV laser energy per pulse versus time interval between pulses of a conventional UV laser system. In a preferred embodiment, an optical modulator (OM) 181 can be inserted between quadrupler 138 and optical component 142. System 120 pre-checks the UV energy per pulse variation with different interval times between pulses and establishes an energy curve. Then a "correction" signal is generated based upon the energy curve information and applied to OM 181. FIG. 9B is a graph showing the correction signal applied to OM 181 to compensate for the respective time intervals. Whenever a laser pulse 44 is fired, the correction signal will be triggered, so the control signal voltage on OM 181 will change with the time elapsed after the last laser pulse firing. Whenever the next laser pulse is fired, the correction signal on OM 181 will ensure that the laser energy following the correction signal will remain at a pre-set constant level, regardless of the interval time between any two consecutive laser pulses 44. FIG. 9C is the UV energy pulse after correction with OM 181. Skilled persons will appreciate that with this approach, the highest system positioning speed can be implemented without variation of the UV laser energy per pulse despite different time intervals between pulses 44.

Skilled workers will recognize that portions of this invention may be implemented differently from the implementations described above for preferred embodiments. For example, system control computer 170, OM controller 171 and beam positioner controller 160, may be combined into a single processor or may be implemented as some combination of hard wired digital logic, programs executing in a signal processor, microprocessor, state machine, or analog circuitry.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method of severing an electrically conductive link fabricated on a semiconductor substrate in an integrated circuit link structure that includes a top surface and an inorganic dielectric passivation layer positioned between the link and the substrate, the link having a link width and the passivation layer having a height and wavelength-sensitive light absorption characteristics, comprising:

generating and directing toward the link structure ultraviolet laser output having, at a predetermined wavelength, energy characterized by a power density distributed over a spot area on the top surface of the link structure, the spot area having a diameter of less than about 2.0 μm and covering the link width and an adjacent portion of the passivation layer not overlapped by the link, the power density being of sufficient magnitude to sever the link and in cooperation with the predetermined wavelength interacting with the passivation layer such that its wavelength-sensitive light absorption characteristics and height cause the adjacent portion of the passivation layer not overlapped by the link to attenuate off-link energy of the laser output incident to the adjacent portion during severing of the link to prevent the laser output from damaging the substrate.

2. The method of claim 1 in which the predetermined wavelength of the laser output is shorter than about 300 nm.

3. The method of claim 2 in which the predetermined wavelength of the laser output is about 266 nm, 262 nm, 212 nm, 210 nm, or 193 nm.

4. The method of claim 3 in which the generating of ultraviolet laser output further comprises forming a pulsed ultraviolet laser output by optically pumping a Q-switched ultraviolet light emitting solid-state laser.

5. The method of claim 1 in which the passivation layer comprises silicon dioxide or silicon nitride.

6. The method of claim 5 in which the height of the passivation layer is at least about 0.5 μm.

7. The method of claim 1 in which the link is one of multiple electrically conductive links fabricated on the substrate that are mutually spaced apart by a pitch distance of less than about 2.5 μm.

8. The method of claim 1 in which the link width is less than or equal to about 1.0 μm.

9. The method of claim 1 in which the spot area has a diameter of less than about 1 μm.

10. The method of claim 1 in which the laser output removes a portion of the passivation layer that is underlying and overlapped by the link to ensure that substantially all of the link within the spot area is removed and that the substrate underlying and overlapped by the link is undamaged.

11. The method of claim 1 in which the link structure further comprises a top passivation layer positioned over the link such that the top passivation layer is at least partly directly ablated by the ultraviolet laser output that severs the link.

12. The method of claim 1 in which the link forms part of a memory device or an ASIC.

13. The method of claim 1 in which the passivation layer is doped to increase its absorption at the predetermined wavelength.

14. The method of claim 1 in which the predetermined wavelength of the laser output is about 349 nm or 355 nm.

15. The method of claim 1 in which the passivation layer underlying and overlapped by the link attenuates energy of the laser output in excess of that required to sever the link to ensure that the substrate underlying and overlapped by the link is undamaged.

16. The method of claim 1 in which the link is one of multiple electrically conductive links fabricated on the substrate, the links being separated from one another by passivation material having wavelength-sensitive light absorption characteristics such that the passivation material attenuates energy of the laser output reflected from a first one of the links toward a second one of the links to prevent the laser output from damaging the second link.

17. A method of severing a first electrically conductive link fabricated on a semiconductor substrate, the first link being separated from a second electrically conductive link by an inorganic dielectric passivation material positioned between them and having wavelength-sensitive light absorption characteristics, comprising:

generating and directing at a predetermined wavelength toward the first link ultraviolet laser output having energy characterized by a power density of sufficient magnitude over a spot area having a diameter of less than about 2.0 μm to sever the link and in cooperation with the predetermined wavelength interacting with the passivation material, such that the wavelength-sensitive light absorption characteristics of the passivation material cause it to attenuate energy of the laser output reflected from the first link toward the second link to prevent the laser output from damaging the second link.

18. The method of claim 17 in which the predetermined wavelength of the laser output is shorter than about 300 nm.

19. The method of claim 17 in which the first and second links are spaced apart by a pitch distance of less than about 2.5 μm.

20. A method of severing an electrically conductive link between a pair of electrically conductive contact pads fabricated on a semiconductor substrate in an integrated circuit link structure that includes an inorganic dielectric passivation layer positioned between the link and the substrate, the passivation layer having a height and wavelength-sensitive light absorption characteristics, comprising:

generating and directing toward the link structure ultraviolet laser output having energy characterized by a power density of sufficient magnitude over a spot area of a diameter of less than about 2.0 μm and a predetermined wavelength interacting with the wavelength-sensitive light absorption characteristics of the passivation layer to sever the link, the height and wavelength-sensitive light absorption characteristics of the passivation layer cooperating to prevent the laser output from damaging the substrate underlying the link.

21. The method of claim 20 in which the predetermined wavelength of the laser output is shorter than about 300 nm.

22. The method of claim 21 in which the predetermined wavelength of the laser output is about 266 nm, 262 nm, 212 nm, 210 nm, or 193 nm.

23. The method of claim 20 in which the predetermined wavelength of the laser output is about 349 nm or 355 nm.

24. The method of claim 11 in which the top passivation layer is doped to increase its absorption at the predetermined wavelength.

25. The method of claim 17 in which the passivation material is doped to increase its absorption at the predetermined wavelength.

26. The method of claim 17 in which the predetermined wavelength of the laser output is about 349 nm or 355 nm.

27. The method of claim 18 in which the predetermined wavelength of the laser output is about 266 nm, 262 nm, 212 nm, 210 nm, or 193 nm.

28. The method of claim 1 in which the predetermined wavelength of the laser output comprises a third harmonic of a fundamental wavelength generated by an Nd:YLF, Nd:YAG, or Nd:YVO$_4$ laser.

29. The method of claim 17 in which the predetermined wavelength of the laser output comprises a third harmonic of a fundamental wavelength generated by an Nd:YLF, Nd:YAG, or Nd:YVO$_4$ laser.

30. The method of claim 20 in which the predetermined wavelength of the laser output comprises a third harmonic of a fundamental wavelength generated by an Nd:YLF, Nd:YAG, or Nd:YVO$_4$ laser.

31. The method of claim 17 in which the spot area has a diameter of less than about 1.0 μm.

32. The method of claim 1 in which the power density is less than or equal to 10 µJ distributed over the spot area.

33. The method of claim 17 in which the power density is less than or equal to 10 µJ distributed over the spot area.

34. The method of claim 20 in which the power density is less than or equal to 10 µJ distributed over the spot area.

35. The method of claim 17 in which the passivation material between the first and second links is at least about 0.5 µm thick.

36. The method of claim 20 in which the height of the passivation layer is at least about 0.5 µm.

37. The method of claim 17 in which the first and second links have a link width that is less than or equal to about 1.0 µm.

38. The method of claim 20 in which the link width is less than or equal to about 1.0 µm.

39. The method of claim 20 in which the link is one of multiple electrically conductive links fabricated on the substrate that are mutually spaced apart by a pitch distance of less than about 2.5 µm.

40. The method of claim 14 in which the passivation layer is doped with an element from Group III or Group V.

41. The method of claim 17 in which the passivation layer is doped with an element from Group III or Group V and the predetermined wavelength of the laser output is about 349 nm or 355 nm.

42. The method of claim 20 in which the predetermined wavelength interacts with the wavelength-sensitive light absorption characteristics of the passivation layer to form a depthwise crater within the passivation layer underlying the link to create high electrical open resistance across the contact pads.

43. The method of claim 1 in which the link structure further comprises a top passivation layer positioned over the link such that the ultraviolet laser output that severs the link causes a thermally induced stress build up to remove the top passivation layer as the link is severed.

44. The method of claim 17 in which the passivation layer has UV wavelength absorption properties similar to or including those of $SiO_2$ or SiN.

45. The method of claim 20 in which the passivation layer has UV wavelength absorption properties similar to or including those of $SiO_2$ or SiN.

* * * * *

UNITED STATES PATENT AND TRADEMARK OFFICE
CERTIFICATE OF CORRECTION

PATENT NO. : 6,057,180
DATED : May 2, 2000
INVENTOR(S) : Edward Swenson and Yunlong Sun Page 1 of 1

It is certified that error appears in the above-identified patent and that said Letters Patent is hereby corrected as shown below:

Column 5,
Line 18, "shoter" should read -- shorter --.

Column 7,
Line 20, "shoter" should read -- shorter --.

Column 7,
Line 41, "most preferably less than or equal to about 0.5 µm" should read -- preferably less than 1 µm --. --.

Signed and Sealed this

Thirty-first Day of July, 2001

Attest:

NICHOLAS P. GODICI
Attesting Officer
Acting Director of the United States Patent and Trademark Office